(12) United States Patent
McNally

(10) Patent No.: US 8,599,575 B1
(45) Date of Patent: Dec. 3, 2013

(54) METHODS, DEVICES, AND SYSTEMS FOR FILTERING ELECTROMAGNETIC INTERFERENCE

(75) Inventor: Stephen D. McNally, San Diego, CA (US)

(73) Assignee: DJM Electronics, Inc, San Diego, CA (US)

( * ) Notice: Subject to any disclaimer, the term of this patent is extended or adjusted under 35 U.S.C. 154(b) by 128 days.

(21) Appl. No.: 13/018,175

(22) Filed: Jan. 31, 2011

Related U.S. Application Data

(60) Provisional application No. 61/301,134, filed on Feb. 3, 2010.

(51) Int. Cl.
*H05K 9/00* (2006.01)
(52) U.S. Cl.
USPC .......................... 361/818; 361/816; 361/789
(58) Field of Classification Search
USPC .............. 174/353; 361/789, 816, 818; 333/12
See application file for complete search history.

(56) References Cited

U.S. PATENT DOCUMENTS

| | | | | |
|---|---|---|---|---|
| 4,369,361 A * | 1/1983 | Swartz et al. | ................. | 235/470 |
| 4,658,334 A * | 4/1987 | McSparran et al. | .......... | 361/800 |
| 4,739,453 A * | 4/1988 | Kurokawa | ..................... | 361/816 |
| 5,072,193 A * | 12/1991 | Wilson et al. | ..................... | 330/66 |
| 5,545,494 A * | 8/1996 | Trumble et al. | ............... | 429/163 |
| 5,566,040 A * | 10/1996 | Cosquer et al. | ............... | 361/113 |
| 5,856,770 A * | 1/1999 | Mantese et al. | ............... | 333/182 |
| 6,194,993 B1 * | 2/2001 | Hayashi et al. | ............ | 340/10.34 |
| 6,576,833 B2 * | 6/2003 | Covaro et al. | ................. | 174/359 |
| 6,853,781 B2 * | 2/2005 | Chastain et al. | ............... | 385/112 |
| 6,903,910 B1 | 6/2005 | Griesing et al. | | |
| 7,062,575 B2 * | 6/2006 | Garnett et al. | ................... | 710/11 |
| 7,196,275 B2 * | 3/2007 | Babb et al. | ..................... | 174/382 |
| 7,415,892 B2 * | 8/2008 | Lam | ........................... | 73/861.15 |
| 7,574,086 B2 * | 8/2009 | Oh et al. | ........................ | 385/101 |
| 2004/0178681 A1 * | 9/2004 | Klenner | .......................... | 307/66 |
| 2006/0229740 A1 * | 10/2006 | Kreisel et al. | ................... | 700/22 |

OTHER PUBLICATIONS

Cisco 24-Port Channelized T1/E1/J1 Circuit Emulation Over Packet and Channelized ATM Shared Port Adapter Data Sheet, Cisco, Jul. 2007.
Degrees of Protection Provided by Enclosures (IP Code), ANSI/IEC 60529-2004, published by National Electrical Manufacturers Association, , Edition 2.10 Feb. 2001, 2004.

(Continued)

*Primary Examiner* — Boris L Chervinsky
*Assistant Examiner* — Pete Lee
(74) *Attorney, Agent, or Firm* — Wilson, Sonsini, Goodrich & Rosati

(57) ABSTRACT

Provided herein are methods, devices, and systems that relate to electromagnetic interference (EMI) filters that, in certain embodiments, comprise: (a) a housing comprising a substantially enclosed first compartment and a substantially enclosed second compartment; (b) a first circuit card located in the first compartment of the housing that converts a signal transmitted on a conductive based medium to a signal transmitted on a non-conductive based medium; (c) a second circuit card located in the second compartment of the housing that converts a signal transmitted on a non-conductive based medium to a signal transmitted on a conductive based medium; (d) at least one non-conductive based medium that transmits a signal from the first circuit card to the second circuit card; and (e) at least one waveguide through which the non-conductive based medium passes from the first compartment to the second compartment.

20 Claims, 3 Drawing Sheets

(56) References Cited

OTHER PUBLICATIONS

Department of Defense Test Method Standard for Environmental Engineering Considerations and Laboratory Tests, MIL-sTD-810F, Jan. 1, 2000.
Department of Defense Interface Standard: Requirements for the Control of Electromagnetic Interference Characteristics of Subsystems and Equipment, MIL-STD-461F, Dec. 10, 2007.
Detail Specification: Connectors, Electrical, (Circular, Miniature, Quick Disconnect, Environmental Resisting), Receptacles and Plugs, MIL-DTL-26482H, Dec. 7, 2009.
Environmental Handbook for Defence Materiel: Part 4: Natural Environments Defence Standard 00-35(Part 4)/Issue 3 May 7, 1999, Ministry of Defence.
Internetworking Technology Handbook, Cisco Systems, last modified Dec. 17, 2009, published 1992 http://docwiki.cisco.com/wiki/Internetworking_Technology_Handbook.
Military Specification: Requirements for Shock Tests. H.I. (High Impact) Shipboard Machineray, Equipment and Systems, MIL-S-901D, Mar. 17, 1989.
Military Standard Environmental Test Methods for Aerospace and Ground Equipment, MIL-STD-810, Jun. 14, 1962.
NATO, Environmental Guidelines for Defence Materiel, Allied Environmental Conditions and Test Publication (AECTP-100, edition 4), May 2009.
RTCA Digest, Feb. 2008, No. 181, "Environmental Conditions and Test Procedures for Airborne Equipment, DO-160 Version "F" is Available,".
Universal Serial Bus 3.0 Specification, Revision 1.0, Nov. 12, 2008.

* cited by examiner

METHODS, DEVICES, AND SYSTEMS FOR FILTERING ELECTROMAGNETIC INTERFERENCE

CROSS-REFERENCE

This application claims the benefit of U.S. Provisional Application No. 61/301,134 filed Feb. 3, 2010 which is hereby incorporated by reference in its entirety.

BACKGROUND OF THE INVENTION

Data transmission in the digital age is accompanied by electromagnetic disturbances, phenomena, signals, and/or emissions that cause undesired responses or degradation of performance in electrical equipment and signaling. These disturbances, known as electromagnetic interference (EMI), have been characterized into the following groups: conducted emissions and radiated emissions. The source of EMI may be any object, artificial or natural, that carries rapidly changing electrical currents, such as an electrical circuit or the sun.

SUMMARY OF THE INVENTION

The subject matter described herein (including filters, systems of filtering, and corresponding methods of filtering) is useful for reducing electromagnetic interference (EMI) that occurs during the transmission of data into environments where "quiet" levels of electromagnetic interference are desirable, for example, in an electromagnetically shielded enclosure. An electromagnetically shielded enclosure is protected from EMI using a conductive solid or mesh material. A shielded enclosure blocks out an external electromagnetic field because the electrical charges within the enclosure's conductive material redistribute themselves until the external field's effects are cancelled. Similarly, fields within the enclosure are blocked from exiting the enclosure. Conductors penetrating the conductive material (e.g. to bring power or signals into or out of the shielded enclosure) negate the shielded enclosure's ability to block electromagnetic fields and allow the fields to pass freely into and out of the shielded enclosure. Electromagnetic interference (EMI) filters are used to bring conductors into the shielded enclosure and still maintain the shielding integrity of the enclosure.

In certain situations, it is desirable to shield the interior portion of an enclosure from external electromagnetic interference (EMI). In further or additional embodiments, a shielded enclosure is utilized to protect the external portions of an enclosure (i.e., the area outside of the enclosure) from electromagnetic frequencies produced within the enclosure. The effectiveness of a shielded enclosure is dependent on the wavelength of the electromagnetic field it is intended to shield. Shielding effectiveness also depends on the type and thickness of the materials used to surround the enclosure.

The electromagnetic interference filters provided herein are designed to substantially reduce or eliminate electromagnetic interference in a desired shielded enclosure. The United States Federal Communications Commission (FCC) provides rules and regulations governing the electromagnetic radiation from unintentional radiators. See, e.g., 47 C.F.R. §15 (2009). An unintentional radiator is a device that is not designed to produce electromagnetic frequencies. Although electromagnetic interference filters are designed to block or substantially reduce electromagnetic interference, known methods, devices and systems of reducing electromagnetic interference accompanying certain data transmissions into a shielded enclosure require circuitry that contributes electromagnetic interference to the "clean" or "shielded" environment, and thus, these known EMI filters are considered to be an "unintentional radiator."

In one aspect, the subject matter provided herein is directed to electromagnetic interference filters using various signaling protocols (including, but not limited to, for example, the IEEE 802.3 family of standards, the Ethernet 100BASE-T family of standards, the Ethernet 1000BASE-T family of standards, protocols that exceed the transmission rate of one gigabit per second, protocols that exceed the transmission rate of the 1000BASE-T family of standards, and other digital and analog signaling protocols) that provide a substantial reduction in unintentional radiation (for example at certain frequencies or ranges of frequencies). In another aspect, the subject matter provided herein is directed to providing electromagnetic filtration to unmet applications, including, for example ruggedized applications that are common in military and industrial applications. In still a further aspect, provided herein is an electromagnetic interference filter that implements Power over Ethernet (PoE) technology. In still a further embodiment, provided herein is an electromagnetic interference filter that provides at least two signal paths for the same or different protocols in a single compartment of a housing of the filter. In yet an additional embodiment, provided is an electromagnetic interference filter that utilizes at least one signal path and at least one power line (for example Power Over Ethernet or Universal Serial Bus) in a single connector/cable.

The subject matter provided herein includes EMI filters that comprise a housing comprising at least one substantially enclosed compartment. In certain situations, the compartment of the housing is manufactured out of a conductive substance or is coated or plated with a conductive material.

Another feature of the electromagnetic interference filters provided herein is a circuit card located within a compartment of a housing. Typically, the circuit card of the EMI filters provided herein interfaces with a conductive and a non-conductive medium (for example using a jack or a connector). The circuit card sends and receives a signal through each medium (for example, in the form of a transceiver). In certain situations, the circuit cards provided herein communicate according to a communication protocol appropriate to the medium, and the circuitry translates signals from one protocol to another. Different embodiments of the circuit cards provided herein support different data communication protocols including, by way of non-limiting example, Ethernet protocols (including but not limited to the Ethernet 100BASE-T family of standards, the Ethernet 1000BASE-T family of standards, and protocols that exceed the transmission rate of the 1000BASE-T family of standards), Universal Serial Bus (USB), T1/E1/J1, RS-232, ISDN, IEEE 488, IEEE 1394, as well as multiple cabling types such as parallel, coax, twisted pair, and multi-mode and single-mode fiber optics. Also provided herein are circuit cards that connect two dissimilar media types such as twisted pair with fiber optic cabling.

The electromagnetic interference filter provided herein further comprises a conductive based medium attaching to or within the filter. For example, in some embodiments, the conductive based medium is metallic. In further embodiments, the conductive medium is copper, silver, or gold. In some embodiments, a metallic conductive based medium is utilized herein as a single wire or in groups of two or more wires in different physical configurations like coaxial cable, twisted pairs, or parallel cables.

The electromagnetic interference filters provided herein also comprise a non-conductive based medium within the filter. As used herein, a non-conductive based medium includes a medium that is made of a dielectric that does not convey electric charges. For example, in some embodiments, the dielectric is a solid, gas, or liquid. In some embodiments, the non-conductive based medium is a dielectric medium that conveys a signal and is manufactured out of fibers made of glass or plastic (e.g., optical fibers), gases (e.g., air or nitrogen), liquids (like water, oil or alcohol), or a vacuum. In some embodiments, the signal is conveyed on a non-conductive based medium using photons. In further or additional embodiments, the signal is conveyed by electromagnetic radiation (RF or microwave), sound or vibration, or a simple rigid structure that moves or vibrates.

Further provided herein is an electromagnetic interference filter that further comprises a waveguide that passes media through an aperture, from a first compartment, for example, to a second compartment. The term waveguide, as utilized herein, refers to any structure that conveys electromagnetic waves between its endpoints. In some embodiments, the waveguide is a circular, square, rectangular (or other geometric configuration) shaped hollow conductive pipe.

A feature of the subject matter described herein is maximizing the reduction of electromagnetic interference (EMI) in a shielded environment. The performance of the electromagnetic waveguides provided herein is governed by the surface geometry of the apertures (including length and width), the aperture depth, and the shape of the aperture. The waveguide performance is characterized by a combination of two parameters including the Cutoff Frequency (fc), which determines the maximum possible frequency of effectiveness, and the Shielding Effectiveness (SE), which determines the magnitude of the EMI attenuation and is a function of frequency. More specifically, the Cutoff Frequency (fc) is the frequency beyond which the waveguide no longer effectively contains EMI. This frequency is determined by the outside dimensions of the aperture. Increasing the aperture size lowers fc, and decreasing the aperture size raises fc. In some embodiments, the waveguides provided herein have an inner diameter that is less than about 1 inch, less than about 0.9 inches, less than about 0.8 inches, less than about 0.7 inches, less than about 0.6 inches, less than about 0.5 inches, less than about 0.4 inches, less than about 0.3 inches, less than about 0.2 inches, or less than about 0.1 inches.

The Shielding Effectiveness (SE) of a waveguide represents the amount of EMI attenuation that the waveguide offers at a given frequency. This is dependent on several factors. These include the surface geometry of the aperture (length and width), depth, and shape of aperture. An increase in depth increases the Shielding Effectiveness. In some embodiments, the ratio of the length of the electromagnetic waveguide to its smallest diameter is greater than 1, greater than 2, greater than 3, greater than 4, or greater than 5.

The Cutoff Frequency of the waveguides provided herein is the lowest frequency for which a mode will propagate in it. The Cutoff Frequency is found with the characteristic equation of the Helmholtz equation for electromagnetic waves, which is derived from the electromagnetic wave equation by setting the longitudinal wave number equal to zero and solving for the frequency. Thus, any exciting frequency lower than the Cutoff Frequency will attenuate, rather than propagate.

The following derivation assumes lossless walls. The value of c, the speed of light, should be taken to be the group velocity of light in whatever material fills the waveguide.

For a rectangular waveguide, the Cutoff Frequency is $$\omega_c = c\sqrt{\left(\frac{n\pi}{a}\right)^2 + \left(\frac{m\pi}{b}\right)^2},$$

where n,m≥0 are the mode numbers and a and b the lengths of the sides of the rectangle. The Cutoff Frequency of a waveguide of circular cross-section (the transverse-magnetic mode with no angular dependence and lowest radial dependence) is given by $$\omega_c = c\frac{\chi_{01}}{r} = c\frac{2.4048}{r},$$

where r is the radius of the waveguide, and $\chi_{01}$ is the first root of $J_0(r)$, the bessel function of the first kind of order 1.

In one embodiment, provided herein is an electromagnetic interference (EMI) filter comprising: (a) a housing comprising a substantially enclosed first compartment and a substantially enclosed second compartment; (b) a first circuit card located in the first compartment of the housing that converts a signal transmitted on a conductive based medium to a signal transmitted on a non-conductive based medium; (c) a second circuit card located in the second compartment of the housing that converts a signal transmitted on a non-conductive based medium to a signal transmitted on a conductive based medium; (d) at least one non-conductive based medium that transmits a signal from the first circuit card to the second circuit card; and (e) at least one waveguide through which the non-conductive based medium passes from the first compartment to the second compartment; that is characterized by one or more of the following: (i) the filter being designed to meet or exceed at least a portion of a military specification or standard; (ii) the housing being designed to meet or exceed at least a portion of a military specification or standard; (iii) at least one of the conductive based media being embodied in a connector that is designed to meet or exceed at least a portion of a military specification or standard; (iv) at least one of the compartments being designed to meet or exceed at least a portion of a military specification or standard; or (v) at least one of the circuit cards being designed to meet or exceed at least a portion of a military specification or standard. In further or additional embodiments, the filter complies with at least one of the following standards or specifications (including but not limited to certain military standards): MIL-STD-810, MIL-DTL-26482, TEMPEST, DEF STAN 00-35, AECTP-100, or an IP rating of 50 or greater. In still further embodiments, the first or second compartment of an EMI filter has been completely or partially filled with a non-conductive solid compound, a ferrite loaded compound or a conformal coating. In yet additional embodiments, the EMI filter comprises a housing that comprises an antichafe material.

In one embodiment, provided is an electromagnetic interference (EMI) filter comprising: (a) housing comprising a substantially enclosed first compartment and a substantially enclosed second compartment; (b) a first circuit card located in the first compartment of the housing that converts a signal transmitted on a conductive based medium to a signal transmitted on a non-conductive based medium; (c) a second circuit card located in the second compartment of the housing that converts a signal transmitted on a non-conductive based medium to an Ethernet signal that is compliant with the IEEE 802.3 family of standards; (d) at least one non-conductive based medium that transmits a signal from the first circuit card to the second circuit card; and (e) at least one waveguide through which the non-conductive based medium passes from the first compartment to the second compartment; wherein the filter provides a radiated electromagnetic emission amplitude (dBµV/m) versus frequency (Hz) graph having a largest peak within a frequency range of about 30 MHz to about 1 GHz that is equal to or less than about 44 dBµV/m when measured at a distance of about 3 meters from the filter.

In another embodiment, provided herein is an electromagnetic interference (EMI) filter comprising: (a) a housing comprising a substantially enclosed first compartment and a substantially enclosed second compartment; (b) a first circuit card located in the first compartment of the housing that converts a signal transmitted on a conductive based medium to a signal transmitted on a non-conductive based medium; (c) a second circuit card located in the second compartment of the housing that converts a signal transmitted on a non-conductive based medium to an Ethernet signal that is compliant with a 100BASE-T standard; (d) at least one non-conductive based medium that transmits a signal from the first circuit card to the second circuit card; and (e) at least one waveguide through which the non-conductive based medium passes from the first compartment to the second compartment; the filter provides a radiated electromagnetic emission amplitude (dBµV/m) versus frequency (Hz) graph having a largest peak within a frequency range of about 30 MHz to about 1 GHz that is equal to or less than about 40 dBµV/m when measured at a distance of about 3 meters from the filter. In further or additional embodiments, provided herein is an EMI filter that provided a radiated electromagnetic emission amplitude (dBµV/m) versus frequency (Hz) graph having a largest peak within the frequency range of about 350 MHz to about 400 MHz that is equal to or less than about 40 dBµV/m when measured at a distance of about 3 meters from the filter. In yet additional embodiments, provided herein is an EMI filter that provides a radiated electromagnetic emission amplitude (dBµV/m) versus frequency (Hz) graph having a largest peak within the frequency range of about 370 MHz to about 380 MHz that is equal to or less than about 40 dBµV/m when measured at a distance of about 3 meters from the filter. In still further embodiments, provided herein is an EMI filter that provides a radiated electromagnetic emission amplitude (dBµV/m) versus frequency (Hz) graph having a largest peak at a frequency of about 376 MHz that is equal to or less than about 40 dBµV/m when measured at a distance of about 3 meters from the filter.

In another embodiment, provided herein is an EMI filter comprising: (a) a housing comprising a substantially enclosed first compartment and a substantially enclosed second compartment; (b) a first circuit card located in the first compartment of the housing that converts a signal transmitted on a conductive based medium to a signal transmitted on a non-conductive based medium; (c) a second circuit card located in the second compartment of the housing that converts a signal transmitted on a non-conductive based medium to an Ethernet signal that complies with a 1000BASE-T standard and that is transmitted on a conductive based medium; (d) at least one non-conductive based medium that transmits a signal from the first circuit card to the second circuit card; and (e) at least one waveguide through which the non-conductive based medium passes from the first compartment to the second compartment; and the filter provides a radiated electromagnetic emission amplitude (dBµV/m) versus frequency (Hz) graph having a largest peak within the frequency range of about 30 MHz to about 1 GHz that is equal to or less than about 44 dBµV/m when measured at a distance of about 3 meters from the filter. In further embodiments, the EMI filters described herein provide a radiated electromagnetic emission amplitude (dBµV/m) versus frequency (Hz) graph having a largest peak within the frequency range of about 550 MHz to about 570 MHz that is equal to or less than about 44 dBµV/m when measured at a distance of about 3 meters from the filter. In further or additional embodiments, the EMI filters described herein provide a radiated electromagnetic emission amplitude (dBµV/m) versus frequency (Hz) graph having a largest peak within the frequency range of about 560 MHz to about 565 MHz that is equal to or less than about 44 dBµV/m when measured at a distance of about 3 meters from the filter. In still further embodiments, the EMI filters described herein provide a radiated electromagnetic emission amplitude (dBµV/m) versus frequency (Hz) graph having a largest peak at a frequency of about 563 MHz that is equal to or less than about 44 dBµV/m when measured at a distance of about 3 meters from the filter.

In another embodiment, provided herein is an electromagnetic interference (EMI) filter comprising: (a) a housing comprising a substantially enclosed first compartment and a substantially enclosed second compartment; (b) a first circuit card that converts a signal transmitted on a conductive based medium to a signal transmitted on a non-conductive based medium and located in the first compartment of the housing; (c) a second circuit card located in the second compartment of the housing that converts a signal transmitted on a non-conductive based medium to a signal transmitted on a conductive based medium; (d) at least one non-conductive based medium that transmits a signal from the first circuit card to the second circuit card; and (e) at least one waveguide through which the non-conductive based medium passes from the first compartment to the second compartment; and the filter utilizes, passes, or provides a digital signal with integrated power. In some embodiments, the filter utilizes, passes, or provides a digital signal compliant with a specification that provides for integrated power.

In particular embodiments, the housing has a volume that is less than 150 cubic inches. In some embodiments, the digital signal is an Ethernet signal. In further or additional embodiments, the digital signal is compliant with Universal Serial Bus (USB) version 1.0 or greater. In further embodiments, the digital signal or specification is Power Over Ethernet (POE), Universal Serial Bus (USB), IEEE 1394 (FireWire), or eSATAp.

In one embodiment, provided is an electromagnetic interference (EMI) filter that comprise: (a) a housing comprising a substantially enclosed first compartment and a substantially enclosed second compartment; (b) a first circuit card located in the first compartment of the housing that converts a signal transmitted on a conductive based medium to a signal transmitted on a non-conductive based medium; (c) a second circuit card located in the second compartment of the housing that converts a signal transmitted on a non-conductive based medium to a signal transmitted on a conductive based medium that conveys data at a rate faster than one gigabit per second; (d) at least one non-conductive based medium connector that transmits a signal from the first circuit card to the second circuit card; and (e) at least one waveguide through which the non-conductive based medium connector passes from the first compartment to the second compartment.

In one embodiment, provided herein is an electromagnetic interference (EMI) filter comprising: (a) a housing comprising a substantially enclosed first compartment and a substantially enclosed second compartment; (b) a first circuit card located in the first compartment of the housing that converts a signal transmitted on a conductive based medium to a signal transmitted on a non-conductive based medium; (c) a second circuit card located in the second compartment of the housing that converts a signal transmitted on a non-conductive based medium to an Ethernet signal that is transmitted on a conductive based medium at a rate that exceeds the data transmission speed as defined by IEEE 802.3 ab-1999 standard (also referred to as 1000BASE-T); (d) at least one non-conductive based medium connector that transmits a signal from the first circuit card to the second circuit card; and (e) at least one waveguide through which the non-conductive based medium connector passes from the first compartment to the second compartment. In a specific embodiment, provided is an electromagnetic interference (EMI) filter comprising: (a) a housing comprising a substantially enclosed first compartment and a substantially enclosed second compartment; (b) a first circuit card located in the first compartment of the housing that converts a signal transmitted on a conductive based medium to a signal transmitted on a non-conductive based medium; (c) a second circuit card located in the second compartment of the housing that converts a signal transmitted on a non-conductive based medium to a signal transmitted on a conductive based medium; (d) at least one non-conductive based medium that transmits a signal from the first circuit card to the second circuit card; (e) at least one waveguide through which the non-conductive based medium passes from the first compartment to the second compartment; and (d) the first or second compartment further comprises at least a second conductive based medium. In some embodiments, the conductive based medium carries a digital signal. In further or additional embodiments, digital signal is compliant with IEEE 802.3 (including as one example Ethernet). In some embodiments, the digital signal is not compliant with any standard. In further embodiments, the digital signal is compliant with 1000BASE-T. In specific embodiments, the EMI filter passes power from at least the first compartment to the second compartment in order for the first circuit card and the second circuit card to be powered from a single power source. In other embodiments, the filter further comprises an external AC/DC power transformer attached to the filter using a connector that does not rely solely on friction. In still further embodiments, the filter further comprises an AC/DC power transformer that is located in at least the first or second compartments. In yet additional embodiments, the filter further comprises a power source that is supplied by the same cable transmitting the communication signal. In certain embodiments, the filter further comprises a power supply that is a battery or fuel cell. In certain embodiments, the filter further comprises an AC/DC power transformer that supplies power to a shielded enclosure that is attached to the filter. In yet additional embodiments, the filter is powered by a power source from an attached shielded enclosure.

In another embodiment, the housing of the EMI filters provided herein has a volume that is equal to or less than about 40 cubic inches. In further or additional embodiments, the filter further comprises a connector to mechanically, chemically, or conductively bond the housing to an electromagnetically shielded enclosure. In still further embodiments, the filters provided herein further comprise at least one conductor based input or output connector attached to or exiting the housing. In yet additional embodiments, the filters provided herein further comprise a non-conductive medium that is at least one optical fiber.

In further embodiments, the filters provided herein further comprise a waveguide that has an inner diameter that is less than 1 inch. In other embodiments, the waveguide has a ratio of the length of the electromagnetic waveguide to its smallest diameter is greater than 1.

In yet additional embodiments, the first or second compartment of the EMI filters described herein incorporates at least one solid or braided shield to separate all or a portion of the circuit card from the conductor based medium. In one embodiment, the first or second compartment incorporates at least one solid or braided shield to separate all or a portion of the conductor based medium from the circuit card.

In specific embodiments, the EMI filters provided herein further contain a conductive based medium that passes through one or more ferrites having an initial permeability of less than 100. In other embodiments, the conductive based medium passes through at least one additional electromagnetic interference filter before exiting the compartment. In still further embodiments, the EMI filters provided herein further comprise a visual communication of power and/or communication status.

BRIEF DESCRIPTION OF THE DRAWINGS

Many features provided herein are set forth with particularity in the appended claims. A better understanding of the features and advantages herein will be obtained by reference to the following detailed description that sets forth illustrative embodiments, in which many principles are utilized, and the accompanying drawings of which:

DETAILED DESCRIPTION OF THE INVENTION

While preferred embodiments of the present invention have been shown and described herein, a person of ordinary skill in the art will appreciate that such embodiments are provided by way of example only. Numerous variations, changes, and substitutions will now occur to those skilled in the art without departing from the invention. It should be understood that various alternatives to the embodiments of the invention described herein are employed in practicing the invention. Many features herein are set forth with particularity in the appended claims. It is intended that the claims define the scope of the invention and that methods and structures within the scope of these claims and their equivalents be covered thereby.

A better understanding of the features and advantages of the present invention will be obtained by reference to the following detailed description that sets forth illustrative embodiments, in which many principles of the invention are utilized. The section headings used herein are for organizational purposes only and are not to be construed as limiting the subject matter described.

Figure 1:
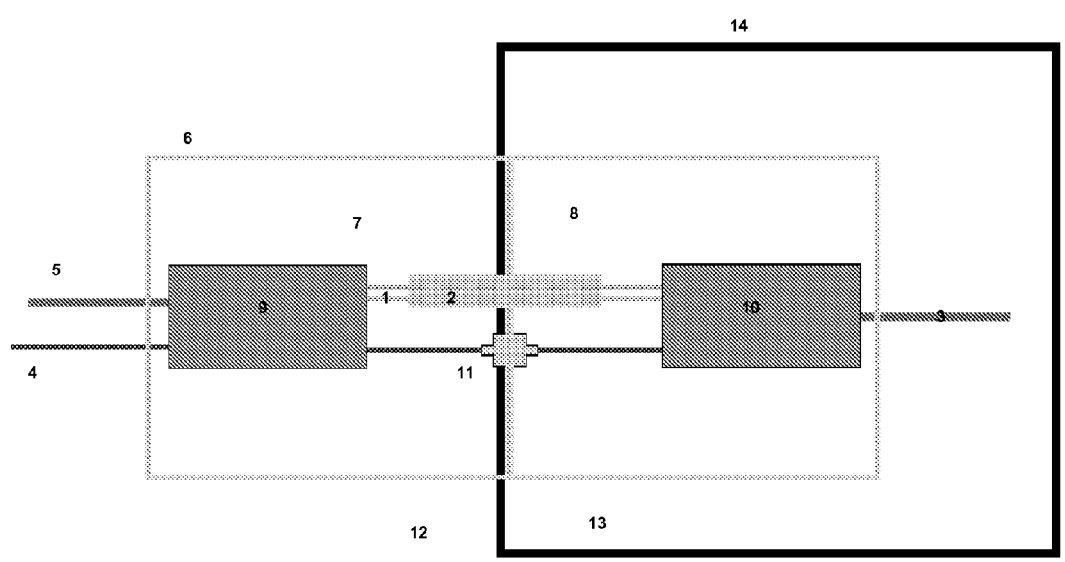
FIG. 1 is illustrative of an electromagnetic interference (EMI) filter that utilizes a non-conductive based medium and a waveguide to pass a signal carried on a conductive based medium into an electromagnetically shielded enclosure without affecting the shielding effectiveness of the enclosure over a certain electromagnetic frequency bandwidth.

Referring to FIG. 1, provided is an illustration of an electromagnetic interference (EMI) filter that permits entry of a non-conductive based medium 1 and a waveguide 2 to pass a signal carried on the conductive based medium 3 into an electromagnetically shielded enclosure 14 without affecting the shielding effectiveness of the enclosure over a specific electromagnetic frequency bandwidth. Also provided in FIG. 1 is a supply 4 and signal input/output (e.g., a conductive based medium) 5, a housing 6 comprising a substantially enclosed first compartment 7 and a substantially enclosed second compartment 8. Further provided in FIG. 1 is a first circuit card 9 within the first compartment 7 and a second circuit card 10 within the second compartment 8, and a device that filters power 11 as it is passed from the first compartment 7 to the second compartment 8.

Further reference is made to FIG. 1 whereby a circuit card 9 (e.g., a media converter) in the first compartment 7 converts the signal from the conductive based medium 5 to a non-conductive based medium 1 and passes through a waveguide 2 to a circuit card in a second compartment where it is converted back onto a conductive medium. The circuit card 9, in certain embodiments, is powered 4 from one side thereby avoiding the need for power inside the shielded enclosure. In these and other situations, power for the second card 10 is passed through an integrated EMI power filter 11 that maintains the shielding effectiveness of the enclosure. Also shown in FIG. 1 is the "dirty side" 12 and the "clean side" 13. In certain situations, the "clean side" 13 of the filter is open to the inside of the shielded enclosure and becomes a part of that environment when the filter is mechanically attached to the enclosure. The "dirty side" 12 is open to the environment outside of the enclosure. In certain situations, the "clean side" 13 is protected from electromagnetic radiation occurring in the "dirty" 12 side. In further or additional embodiments, it is also to be understood by a person of ordinary skill in the art that the "dirty side" 12 (the area shown outside of the shielded enclosure) is protected from the electromagnetic radiation emanating from inside the "clean" 13 environment. That is, the meaning of the phrases "dirty" and "clean" as used herein depend on the circumstances and do not refer to the level of electromagnetic activity inside and outside of the shielded enclosure. In certain situations the shielded enclosure 14 is used to keep electromagnetic energy inside a room so as not to interfere with the environment outside of the room, and in other situations the shielded enclosure is utilized to prevent electromagnetic energy from entering the environment within the enclosure.

Figure 2:
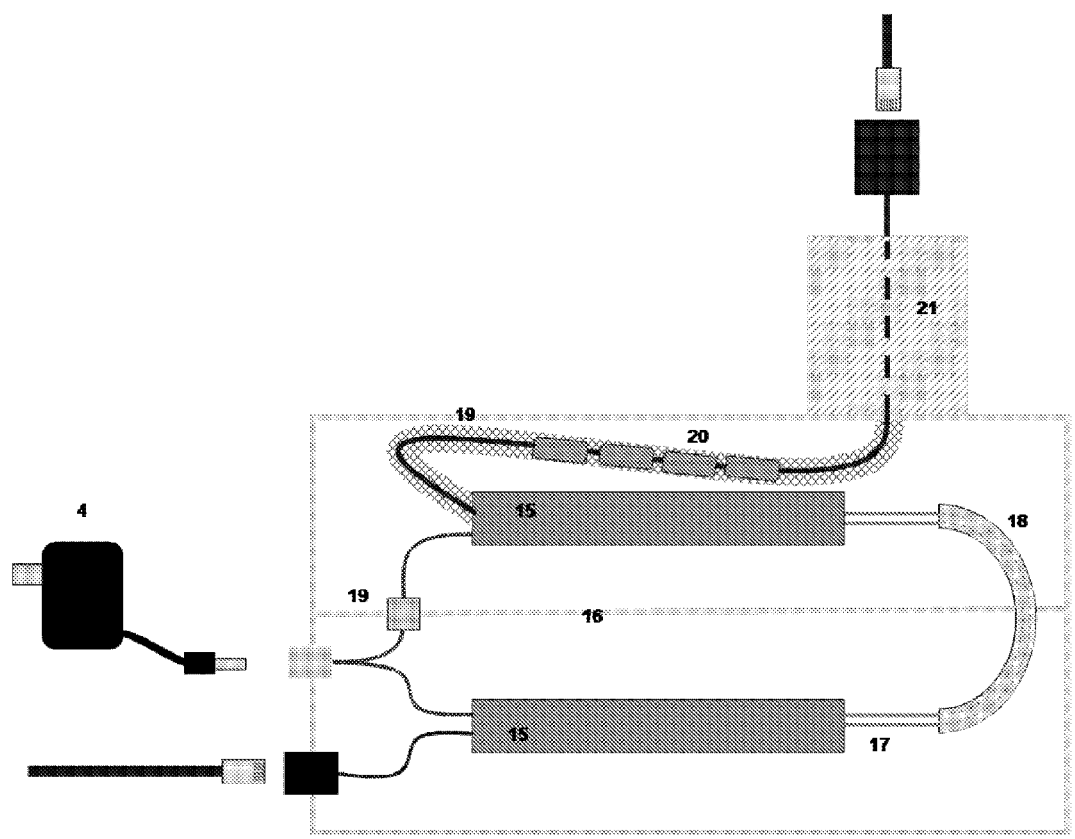
FIG. 2 is illustrative of an electromagnetic interference (EMI) filter that transmits an Ethernet signal on a conductive based medium.

Referring to FIG. 2, circuit cards (e.g., media converters) 15 in the respective compartments (16 depicting the dividing line between the respective compartments) of the filter convert the four twisted pair copper Ethernet cable (e.g., CAT5, CAT5e, or CAT6) into a fiber optic signal which pass between the two converters along two fibers 17. In order to maintain the shielding integrity between the two compartments, the fibers pass through a waveguide 18 that has been bent into a U-shape in order to reduce the overall size of the filter. The cutoff frequency of the waveguide determines the upper frequency of operation of the filter. At frequencies approaching the cutoff frequency, the ability of the waveguide to block electromagnetic energy decreases rapidly thereby reducing, and eventually eliminating, the shielding effectiveness of the entire shielded enclosure. As the diameter of the waveguide decreases, the cutoff frequency increases. Because the circuit card in the clean side requires power to operate, it is necessary to pass power through an EMI filter 19 (e.g., a feed through capacitor). It is desirable to have limited or no electromagnetic emissions radiating from the circuit card 15 in at least one side of the filter. In order to decrease the emissions coming from the circuit card, the filter implements two components. The first technique is a braided copper mesh 19 that is grounded at the circuit card 15 and encompasses the twisted pairs as they leave the filter into the shielded enclosure and is then grounded to the filter housing at the exit. This mesh shield acts to limit the amount of energy that can escape the "clean side" directly as radiated emissions or can couple onto the twisted pairs and exit as conducted emissions. The twisted pairs pass through the beads and the entire assembly is located inside the braided copper mesh 19. The second component is a formulated ferrite bead(s) 20 designed to attenuate the high frequency signals which radiate from the circuit cards. The twisted pairs exit the filter through a threaded penetration 21 which is used to mechanically attach the filter to the shielded enclosure. A flange nut and wire gasket (not shown) are used to compress the filter against the shield wall until an electromagnetic seal is created.

Figure 3:
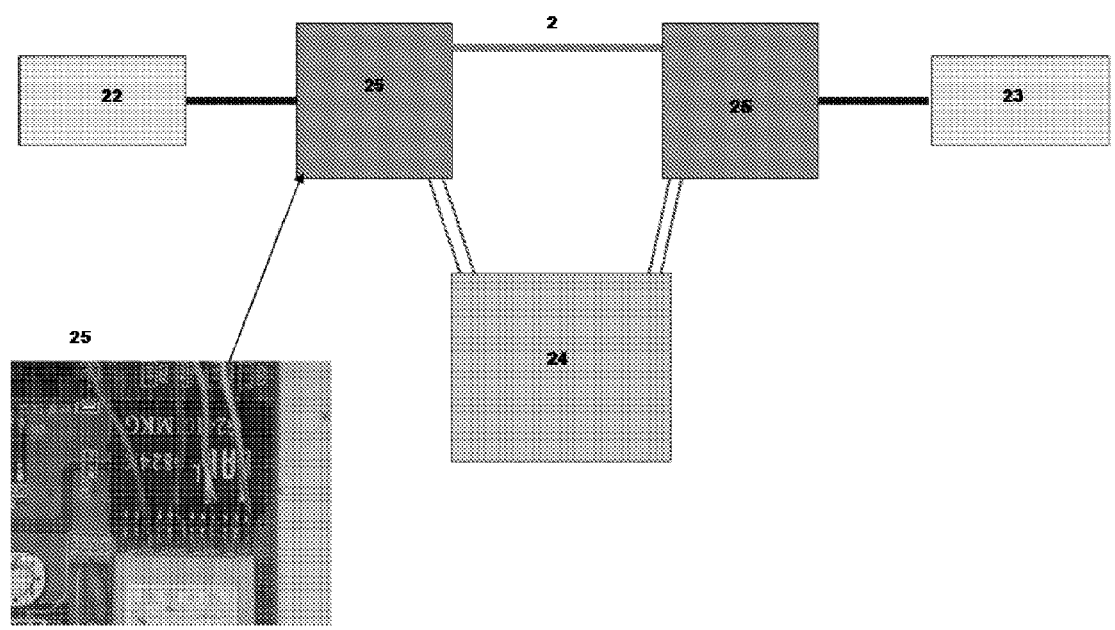
FIG. 3 is illustrative of a method for transmitting electrical power integrated with data over twisted pair cabling in the form of Power over Ethernet (PoE).

Referring to FIG. 3, provided is an EMI filter implementing a method for transmitting electrical power integrated with data over twisted pair cabling in a manner compliant with a Power over Ethernet (PoE) standard. Power over Ethernet (PoE) is a method of passing electrical power, along with data, over twisted pair cabling. The IEEE 802.3af PoE standard (ratified June, 2003) provides a method for power sourcing equipment (PSE) 22 to identify a device that can use PoE (also referred to as a powered device or PD 23) to determine how much power to provide and when to shut power off. The powered device displays electrical signatures to request power from the power sourcing equipment. The PoE filters provided herein combine the filtering techniques of the Ethernet filter and of a standard power line filter. To achieve this, the power is stripped off the twisted pair in the "dirty side" using a circuit card 25, diverted to an EMI power line filter, and then reinjected back onto the twisted pair in the "clean side." In situations where power is applied to unused twisted pairs, the twisted pairs can be directly connected to the EMI power line filter. In situations where power is applied to twisted pairs carrying data, the power must be picked off at the center taps of an isolation transformer on the media converter. It is then connected to the EMI power line filter 24 and reconnected to the center taps on the "clean side."

Ruggedized Electromagnetic Interference Filters

Ruggedized Components

A first aspect of the subject matter provided herein is the application of an electromagnetic interference filter that is suitable for rugged environmental conditions. Provided herein is a more ruggedized electromagnetic interference filter that can withstand forces typically encountered in militaristic and/or industrial environments, but is not limited for use in, military, industrial, residential or mild to intense commercial environments.

In one aspect, provided here are methods, devices and systems comprising an electromagnetic interference (EMI) filter comprising:

(a) a housing comprising a substantially enclosed first compartment and a substantially enclosed second compartment;

(b) a first circuit card located in the first compartment of the housing that converts a signal transmitted on a conductive based medium to a signal transmitted on a non-conductive based medium;

(c) a second circuit card located in the second compartment of the housing that converts a signal transmitted on a non-conductive based medium to a signal transmitted on a conductive based medium;

(d) at least one non-conductive based medium that transmits a signal from the first circuit card to the second circuit card; and (e) at least one waveguide through which the non-conductive based medium passes from the first compartment to the second compartment;

that is characterized by one or more of the following: (i) the filter being designed to meet or exceed at least a portion of a military specification or standard; (ii) the housing being designed to meet or exceed at least a portion of a military specification or standard; (iii) at least one of the conductive based media being embodied in a connector that is designed to meet or exceed at least a portion of a military specification or standard; (iv) at least one of the compartments being designed to meet or exceed at least a portion of a military specification or standard; or (v) at least one of the circuit cards being designed to meet or exceed at least a portion of a military specification or standard.

For example, in some embodiments, the military standard that is met or exceeded with the electromagnetic interference filters and uses thereof provided and described herein is the MIL-STD-810 standard, which is known as the "Department of Defense Test Method Standard for Environmental Engineering Considerations and Laboratory Tests" and which emphasizes tailoring an equipment's environmental design and test limits to the conditions that it will experience throughout its service life, and establishing chamber test methods that replicate the effects of environments on the equipment rather than imitating the environments themselves. The MIL-STD-810 test series is approved for use by all departments and agencies of the United States Department of Defense (DoD). In specific embodiments, the military specification or standard is directed to shock, vibration, moisture, temperature, abrasion, dust, mechanical stress, or electrical transients.

In one embodiment, provided is an electromagnetic interference (EMI) filter that complies with at least one of the following standards or specifications MIL-STD-810, MIL-STD-461, MIL-DTL-26482, TEMPEST, DEF STAN 00-35, AECTP-100, or IP50. In further or additional embodiments, provided is an electromagnetic interference (EMI) filter that has been completely or partially filled with a non-conductive solid compound, a ferrite loaded compound or a conformal coating. In still further embodiments, provided is an electromagnetic interference (EMI) filter that further comprises an antichafe material.

Exemplary military specifications and/or standards include, but are not limited to: MIL-STD 810F Method 500.4 Low Pressure (also referred to as altitude testing); MIL-STD 810F Method 501.4 High Temperature (including, for example, both storage and operating conditions); MIL-STD 810F Method 502.4 Low Temperature (including, for example, both storage and operating conditions); MIL-STD 810F Method 503.4 Temperature Shock (which determines in certain situations how well the device handles fluctuations in temperature); MIL-STD 810F Method 504 (testing contamination by fluids); MIL-STD 810F Method 505.4 Solar Radiation (directed to the effects of sunshine); MIL-STD 810F Method 506.4 Rain (directed to testing against the effects of wind blown rain); MIL-STD 810F Method 507.4 Humidity (testing the device against the effects of humidity); MIL-STD 810F Method 508.5 Fungus (whereby the device is exposed to warm moist air in the presence of a fungus); MIL-STD 810F Method 509.4 Salt Fog (does the device rust/fail when exposed to salt fog); MIL-STD 810F Method 510.4 Sand and Dust (how well does the device work when exposed to sand and dust); MIL-STD 810F Method 511.4 Explosive Atmosphere; MIL-STD 810F Method 512.4 Leakage; MIL-STD 810F Method 513.5 Acceleration; MIL-STD 810F Method 514.5 Vibration; MIL-STD 810F Method 515.5 Acoustic Noise; MIL-STD 810F Method 516.5 Shock; MIL-STD 810F Method 518 Acidic Atmosphere; MIL-STD 810F Method 519.5 Gunfire Vibration; MIL-STD 810F Method 520.2 Temp, Humidity, Vibration; MIL-STD 810F Method 521.2 Icing, Freezing Rain; MIL-STD 810F Method 522 Ballistic Shock; or MIL-STD 810F Method 523.2 Vibro-Acoustic/Temperature. In some embodiments the military standard or specification is TEMPEST, MIL-STD-461 or an IP rating of 50 or greater.

In further or additional embodiments, the military specification and/or standard that is met or exceeded by the electromagnetic interference filters provided herein is the MIL-S-901D (Navy), shock tests H.I. (high impact) shipboard machinery, equipment, and systems, and requirements which provides a military specification for shock that is applied to equipment mounted on U.S. Navy ships. In another embodiment, the military specification and/or standard is the DO-160 directed to environmental conditions and test procedures for airborne equipment which outlines a set of minimal standard environmental test conditions (categories) and corresponding test procedures for airborne equipment (published by RTCA, Inc.; see current standard, DO-160F, released Dec. 6, 2007).

The military standards and specifications that the electromagnetic interference filters provided herein meet or exceed are in no way limited to the United States military specifications and standards. In fact, in some embodiments, the military standard or specification is that of the Ministry of Defense (United Kingdom), including by way of non-limiting example Standard 00-35 of the Environmental Handbook for Defense Materiel (Part 3) Environmental Test Methods. See, e.g., DEF STAN 00-35 Part 3 Issue 4 (released Sep. 18, 2006).

Ruggedized Connectors

In particular embodiments, an electromagnetic interference filter comprising a conductive based medium is at least partially surrounded by a connector that is designed to meet or exceed at least a portion of a military specification or standard. For example, in some embodiments, the connector is a connector that complies, at least partially, with the MIL-DTL-26482 standard which is directed to fluids and dust characteristics, or is at least partially compliant with the MIL-DTL-38999 standard directed to quick disconnect connectors (including, for example, bayonet, threaded, and breech coupling), connectors that are environmental resistant, and also connectors that contain a removable crimp and/or a hermetic solder contact.

In a specific embodiment, the electromagnetic interference filters provided herein further comprise at least one bayonet connector (for example, a connector that is compliant with the MIL-DTL-26482, SERIES 1 standard). In further or additional embodiments, the subject matter provided herein further comprises a connector that is an RJ45 connector that complies with the MIL-DTL-26482 or MIL-DTL-38999 standard.

In yet an additional embodiment, provided herein is an EMI filter that further comprises a component that contains an antichafe guard. In specific embodiments, a conductive based medium that is entering, exiting or coming in contact with the housing is protected by a material to prevent abrading or chafing which, in certain situations, will cause a failure of the EMI filter. In some embodiments, the antichafe material provided herein is a foam insert and/or plastic bushing that is implemented on points of contact within the housing of the EMI filter (including for example, threaded penetration points which are particularly sharp and abrasive).

Potting

Another feature of the electromagnetic interference filters provided herein is a filter comprising a circuit card within a housing, or compartment of a housing, that contains a potting material. As contemplated herein, potting is a process of filling an electronic assembly with a solid compound for resistance to shock and vibration, or, in other situations, for exclusion of moisture and corrosive agents. In some embodiments, the potting material utilized herein is made of acrylic, polyurethane, epoxy, silicone or other similar substances. In a specific embodiment, a thermosetting plastic is utilized. In further or additional embodiments, a conformal coating is utilized. A conformal coating refers to applying a layer of material to the electronic circuitry to act as protection against moisture, dust, chemicals, and/or temperature extremes that if uncoated (non-protected) could result in a complete failure of the electronic system. In yet another embodiment, the potting material is a coating that is applied by various methods, for example by brushing, spraying and/or dipping. In certain embodiments, provided herein, due to the increasing complexities of the design of the circuit card, a selective coating is applied. In specific embodiments, the EMI filters provided herein are completely or partially filled with a non-conductive solid compound, a ferrite loaded compound or a conformal coating.

IEEE 802.3 Electromagnetic Interference Filters

A second feature of the subject matter provided herein is an electromagnetic interference (EMI) filter comprising:

(a) a housing comprising a substantially enclosed first compartment and a substantially enclosed second compartment;

(b) a first circuit card located in the first compartment of the housing that converts a signal transmitted on a conductive based medium to a signal transmitted on a non-conductive based medium;

(c) a second circuit card located in the second compartment of the housing that converts a signal transmitted on a non-conductive based medium to an Ethernet signal that is compliant with the IEEE 802.3 family of standards;

(d) at least one non-conductive based medium that transmits a signal from the first circuit card to the second circuit card; and (e) at least one waveguide through which the non-conductive based medium passes from the first compartment to the second compartment;

wherein the filter provides a radiated electromagnetic emission amplitude (dBµV/m) versus frequency (Hz) graph having a largest peak within a frequency range of about 30 MHz to about 1 GHz that is equal to or less than about 44 dBµV/m when measured at a distance of about 3 meters from the filter.

In some embodiments, the Ethernet signal that passes through the EMI filter is compliant with the IEEE 802.3u standard (100BASE-TX) and further provides a radiated electromagnetic emission amplitude (dBµV/m) versus frequency (Hz) graph having a largest peak within the frequency range of about 30 MHz to about 1 GHz that is equal to or less than about 40 dBµV/m when measured at a distance of about 3 meters from the filter. In further or additional embodiments, provided is an EMI filter with a first and/or second compartment that incorporates at least one solid or braided shield to separate all or a portion of at least one circuit card from a conductor based medium. In further or additional embodiments, provided is an EMI filter that comprises a conductive based medium that that passes through one or more ferrites having an initial permeability of less than about 100. In yet additional embodiments, provided is an EMI filter the comprises a conductive based medium that passes through at least one additional electromagnetic interference filter before exiting the compartment.

100BASE-T Electromagnetic Interference Filters

A third feature of the subject matter provided herein is an electromagnetic interference filter that is compliant with the 100BASE-T family of standards, including for example 100BASE-T and 100BASE-TX, and that is directed to reducing emissions from a "clean" side of the filter as shown, for example, when tested in accordance with the radiated emission testing protocol described in Example 1.

Radiated emissions testing procedures are designed to detect the maximum electric field value radiating from a device under test (DUT). Many examples of testing for shielding effectiveness are known in the art. For example, to provide a controlled test environment and limit reflections and interference from affecting the results of the test, most EMI standards recommend performing radiated emissions test on an Open Area Test Site (OATS).

At the OATS, the DUT is mounted on a turntable which can be rotated 360 degrees. A receiving antenna located at a specific distance from the DUT (typically 3 m or 10 m) is mounted on a mast which can vary the antenna's height from 1 m to 4 m. The DUT is rotated and the antenna height varied while a spectrum analyzer receives the emissions and a computer logs the maximum readings over a particular frequency band.

However, OATS are susceptible to artificial noise due to a variety of broadcasting or radio communications systems, as well as the increasing number of electronic or electric products which have become living necessities. In order to overcome such problems associated with OATS, most EMI standards allow the use of an artificial test site called a semi-anechoic chamber (SAC). A SAC simulates an OATS by creating a test site inside a electromagnetically shielded enclosure lined with electromagnetic absorber. The absorber acts to eliminate reflections and interference inside the enclosure.

Another artificial site allowed by some EMI standards is the GTEM cell. By using special algorithms on the emissions data received using the GTEM cell, the radiated emissions can be correlated with the radiated emissions that would have been received using a theoretically perfect OATS.

In testing the Ethernet filter, it is necessary to modify the test method used to receive the maximum electric field. Because the filter uses techniques to reduce emissions in only the "clean side" of the filter, it is necessary to mount the filter in a shielded enclosure so that only the radiated emissions from the "clean side" are received by the antenna. This requirement makes it impossible to use an OATS, so test sites are limited to SACs or GTEMs.

In certain embodiments, the methods, devices, and systems utilizing the electromagnetic interference (EMI) filters provided herein comprise (a) a housing comprising a substantially enclosed first compartment and a substantially enclosed second compartment; (b) a first circuit card located in the first compartment of the housing that converts a signal transmitted on a conductive based medium to a signal transmitted on a non-conductive based medium; (c) a second circuit card located in the second compartment of the housing that converts a signal transmitted on a non-conductive based medium to an Ethernet signal that is compliant with the 100BASE-T family of standards (e.g., 100BASE-T or 100BASE-TX); (c) at least one non-conductive based medium that transmits a signal from the first circuit card to the second circuit card; and (d) at least one waveguide through which the non-conductive based medium passes from the first compartment to the second compartment; and the filter provides a radiated electromagnetic emission amplitude (dBµV/m) versus frequency (Hz) graph having a largest peak within the frequency range of about 1 MHz to about 1 GHz that is equal to or less than about 40 dBµV/m when measured at a distance of about 3 meters from the filter. Also provided herein are methods of using an EMI filter that provides a radiated electromagnetic emission amplitude (dBµV/m) versus frequency (Hz) graph having a largest peak within the frequency range of about 1 MHz to about 1 GHz that is equal to or less than about 40 dBμV/m when measured at a distance of about 3 meters from the filter.

In further or additional embodiments, the EMI filters and corresponding methods provided herein provide a radiated electromagnetic emission amplitude (dBμV/m) versus frequency (Hz) graph having a largest peak that is equal to or less than about 40 dBμV/m when measured at a distance of about 3 meters from the filter within the frequency range of about 1 MHz to about 950 MHz, about 30 MHz to about 925 MHz, about 50 MHz to about 925 MHz, about 100 MHz to about 900 MHz, about 150 MHz to about 900 MHz, about 200 MHz to about 900 MHz, about 225 MHz to about 900 MHz, about 250 MHz to about 800 MHz, within the frequency range of about 260 MHz to about 700 MHz, within the frequency range of about 270 MHz to about 650 MHz, within the frequency range of about 280 MHz to about 625 MHz, within the frequency range of about 290 MHz to about 600 MHz, within the frequency range of about 300 MHz to about 575 MHz, within the frequency range of about 310 MHz to about 550 MHz, within the frequency range of about 320 MHz to about 525 MHz, within the frequency range of about 330 MHz to about 500 MHz, within the frequency range of about 335 MHz to about 475 MHz, within the frequency range of about 340 MHz to about 450 MHz, within the frequency range of about 345 MHz to about 425 MHz, within the frequency range of about 350 MHz to about 400 MHz, within the frequency range of about 360 MHz to about 390 MHz, within the frequency range of about 370 MHz to about 380 MHz, or at a frequency of about 376 MHz.

In certain embodiments, the EMI filters provided herein are designed to reduce electromagnetic emissions in rooms used for MRI applications which typically require limited or no electromagnetic radiation in the range of 10-130 MHz. In these and other situations, reducing electromagnetic radiation at frequencies lower than 380 MHz in particular is necessary for the particular application in connection with 100BASE-T data transmission. Accordingly, the 100BASE-T family of EMI filters provided herein in certain embodiments, provide a radiated electromagnetic emission amplitude (dBμV/m) versus frequency (Hz) graph having a largest peak within the frequency range of about 1 MHz to about 380 MHz that is equal to or less than about 40 dBμV/m when measured at a distance of about 3 meters from the filter. In further or additional embodiments, the 100BASE-T family of EMI filters described herein provide a radiated electromagnetic emission amplitude (dBμV/m) versus frequency (Hz) graph having a largest peak that is equal to or less than about 40 dBμV/m when measured at a distance of about 3 meters from the filter at each frequency within the frequency range of about 10 MHz to about 380 MHz, within the frequency range of about 20 MHz to about 380 MHz, within the frequency range of about 30 MHz to about 380 MHz, within the frequency range of about 40 MHz to about 380 MHz, within the frequency range of about 50 MHz to about 380 MHz, the frequency range of about 75 MHz to about 380 MHz, within the frequency range of about 100 MHz to about 380 MHz, within the frequency range of about 125 MHz to about 380 MHz, the frequency range of about 150 MHz to about 380 MHz, within the frequency range of about 175 MHz to about 380 MHz, within the frequency range of about 200 MHz to about 380 MHz, within the frequency range of about 250 MHz to about 380 MHz, within the frequency range of about 275 MHz to about 380 MHz, within the frequency range of about 300 MHz to about 380 MHz, within the frequency range of about 325 MHz to about 380 MHz, or within the frequency range of about 350 MHz to about 380 MHz.

In some embodiments, reducing electromagnetic radiation at frequencies greater than 360 MHz in particular is necessary for the particular application in connection with 100BASE-T data transmission. In further or additional embodiments, the 100BASE-T family of EMI filters described herein provide a radiated electromagnetic emission amplitude (dBμV/m) versus frequency (Hz) graph having a largest peak within the frequency range of about 360 MHz to about 1 GHz that is equal to or less than about 40 dBμV/m when measured at a distance of about 3 meters from the filter. In further or additional embodiments, the 100BASE-T family of EMI filters described herein provide a radiated electromagnetic emission amplitude (dBμV/m) versus frequency (Hz) graph having a largest peak that is equal to or less than about 40 dBμV/m when measured at a distance of about 3 meters from the filter within the frequency range of about 360 MHz to about 975 MHz, within the frequency range of about 360 MHz to about 950 MHz, within the frequency range of about 360 MHz to about 900 MHz, within the frequency range of about 360 MHz to about 850 MHz, within the frequency range of about 360 MHz to about 800 MHz, the frequency range of about 360 MHz to about 750 MHz, within the frequency range of about 360 MHz to about 700 MHz, within the frequency range of about 360 MHz to about 650 MHz, the frequency range of about 360 MHz to about 600 MHz, within the frequency range of about 360 MHz to about 550 MHz, within the frequency range of about 360 MHz to about 500 MHz, within the frequency range of about 360 MHz to about 450 MHz, within the frequency range of about 360 MHz to about 400 MHz, or within the frequency range of about 360 MHz to about 380 MHz.

1000BASE-T Electromagnetic Interference Filters

A fourth feature of the subject matter provided herein is an electromagnetic interference filter that is compliant with the 1000BASE-T family of standards, including for example 1000BASE-T and 1000BASE-TX and that are directed to reducing radiated emissions at least at certain frequencies when tested in accordance with the radiated emission testing protocol described in Example 2.

The methods, devices, and systems utilizing the electromagnetic interference (EMI) filters provided herein, in some embodiments, comprise (a) a housing comprising a substantially enclosed first compartment and a substantially enclosed second compartment; (b) a first circuit card located in the first compartment of the housing that converts a signal transmitted on a conductive based medium to a signal transmitted on a non-conductive based medium; (c) a second circuit card located in the second compartment of the housing that converts a signal transmitted on a non-conductive based medium to an Ethernet signal that is compliant with the 1000BASE-T family of standards (e.g. 1000BASE-T and 1000BASE-TX); (d) at least one non-conductive based medium that transmits a signal from the first circuit card to the second circuit card; and (e) at least one waveguide through which the non-conductive based medium passes from the first compartment to the second compartment; and the filter provides a radiated electromagnetic emission amplitude (dBμV/m) versus frequency (Hz) graph having a largest peak within a frequency range of about 1 MHz to about 1 GHz that is equal to or less than about 44 dBμV/m when measured at a distance of about 3 meters from the filter. Also provided herein are methods of using an EMI filter that provides a radiated electromagnetic emission amplitude (dBμV/m) versus frequency (Hz) graph having a largest peak within the frequency range of about 1

MHz to about 1 GHz that is equal to or less than about 44 dBµV/m when measured at a distance of about 3 meters from the filter.

In further or additional embodiments, the EMI filters and corresponding methods described herein provide a radiated electromagnetic emission amplitude (dBµV/m) versus frequency (Hz) graph having a largest peak that is equal to or less than about 44 dBµV/m when measured at a distance of about 3 meters from the filter at each frequency within the frequency range of about 1 MHz to about 950 MHz, about 30 MHz to about 950 MHz, about 50 MHz to about 925 MHz, about 100 MHz to about 900 MHz, about 150 MHz to about 900 MHz, about 200 MHz to about 900 MHz, about 250 MHz to about 900 MHz, about 300 MHz to about 900 MHz, within the frequency range of about 350 MHz to about 800 MHz, within the frequency range of about, 400 MHz to about 700 MHz, within the frequency range of about 450 MHz to about 650 MHz, within the frequency range between about 500 MHz to about 625 MHz, within the frequency range between about 520 MHz to about 600 MHz, within the frequency range between about 530 MHz to about 590 MHz, within the frequency range between about 540 MHz to about 580 MHz, within the frequency range of about 550 MHz to about 570 MHz, that is equal to or less than about 40 dBµV/m when measured at a distance of about 3 meters from the filter, within the frequency range of about 560 MHz to about 565 MHz, or at a frequency of about 563 MHz.

In certain embodiments, reducing electromagnetic radiation at frequencies lower than 580 MHz in particular is necessary for the particular application in connection with 1000BASE-T data transmission. Accordingly, in certain embodiments, provided herein is an EMI filter that provides a radiated electromagnetic emission amplitude (dBµV/m) versus frequency (Hz) graph having a largest peak that is equal to or less than about 44 dBµV/m when measured at a distance of about 3 meters from the filter at each frequency within the frequency range of about 1 MHz to about 580 MHz, about 10 MHz to about 580 MHz, about 25 MHz to about 580 MHz, about 50 MHz to about 580 MHz, about 75 MHz to about 580 MHz, about 100 MHz to about 580 MHz, about 125 MHz to about 580 MHz, about 150 MHz to about 580 MHz, about 175 MHz to about 580 MHz, about 200 MHz to about 580 MHz, about 250 MHz, to about 580 MHz, about 300 MHz to about 580 MHz, about 350 MHz to about 580 MHz, about 400 MHz to about 580 MHz, about 450 MHz to about 580 MHz, about 500 MHz to about 580 MHz, or about 550 MHz to about 580 MHz.

In additional embodiments, reducing electromagnetic radiation at frequencies greater than 550 MHz in particular is necessary for the particular application in connection with 1000BASE-T data transmission. Accordingly, in certain embodiments, the EMI filters described herein provide a radiated electromagnetic emission amplitude (dBµV/m) versus frequency (Hz) graph having a largest peak that is equal to or less than about 44 dBµV/m when measured at a distance of about 3 meters from the filter at each frequency within the frequency range of about 550 MHz to about 1 GHz, about 550 MHz to about 950 MHz, about 550 MHz to about 900 MHz, about 550 MHz to about 850 MHz, about 550 MHz to about 800 MHz, about 550 MHz to about 750 MHz, about 550 MHz to about 700 MHz, about 550 MHz to about 650 MHz, about 550 MHz to about 600 MHz, or about 550 MHz to about 575 MHz.

Electromagnetic Interference Filters with Integrated Data and Power

A fifth feature of the subject matter provided herein is an electromagnetic interference filter for a protocol that integrates data and power on the same medium. Exemplary protocols that integrate data and power include Power over Ethernet (POE), Universal Serial Bus (USB) (including, but not limited to, version 1.0, 1.1, 2.0, 3.0 or similar standard implemented by the USB Implementers Forum), IEEE 1394 (FireWire), and eSATAp.

Utilization of integrated data and power protocols allows for at least one wire that provides power which is connected directly to the circuit card or a transformer that provides the appropriate voltage and current to the circuit card. In some embodiments, the integrated data and power medium is Power over Ethernet (POE) whereby power is extracted from a communication signal using center taps of isolation transformers.

In one embodiment, provided is an electromagnetic interference (EMI) filter comprising:
(a) a housing comprising a substantially enclosed first compartment and a substantially enclosed second compartment;
(b) a first circuit card that converts a signal transmitted on a conductive based medium to a signal transmitted on a non-conductive based medium and located in the first compartment of the housing;
(c) a second circuit card located in the second compartment of the housing that converts a signal transmitted on a non-conductive based medium to a signal transmitted on a conductive based medium;
(d) at least one non-conductive based medium that transmits a signal from the first circuit card to the second circuit card; and
(e) at least one waveguide through which the non-conductive based medium passes from the first compartment to the second compartment;

wherein the filter utilizes, passes, or provides a digital signal compliant with a specification that provides for integrated power. In certain embodiments, the EMI filter has a volume that is less than about 150 cubic inches. In one embodiment, the signal is a network or peer-to-peer protocol. In further or additional embodiments, the signal is a communication protocol between a host and peripheral device.

In some embodiments, for example, provided herein is an electromagnetic interference (EMI) filter comprising: (a) a housing comprising a substantially enclosed first compartment and a substantially enclosed second compartment; (b) a first circuit card that converts a signal transmitted on a conductive based medium to a signal transmitted on a non-conductive based medium and located in the first compartment of the housing; (c) a second circuit card located in the second compartment of the housing that converts a signal transmitted on a non-conductive based medium to a signal transmitted on a conductive based medium; (d) at least one non-conductive based medium that transmits a signal from the first circuit card to the second circuit card; and (e) at least one waveguide through which the non-conductive based medium passes from the first compartment to the second compartment; whereby the filter utilizes, passes, or provides a digital signal with integrated power.

The methods, devices, and systems described herein, in certain embodiments, provide for an EMI filter with Power over Ethernet (PoE). In further or additional embodiments, PoE is utilized by an EMI filter whereby the filter communicates with a power sourcing equipment (PSE) to negotiate the power supply. In further or additional PoE embodiments, the power is extracted from the communication signal using the center taps of the isolation transformers and used to power one or more circuit cards within a first compartment of the EMI filter. Power is then passed through a power line filter to the second compartment of the EMI filter. In specific examples, the power that is passed through to the second compartment is injected back onto the communication signal using the center taps of an isolation transformer on the second circuit card within the second compartment of the EMI filter. A beneficial result of the PoE systems provided herein is high shielding effectiveness which is obtained, in certain situations, when the power line filter provides an insertion loss of 100 dB from 14 kHz to 10 GHz. In further or additional embodiments, the housing the PoE filters provided herein provides a volume that is less than about 150 cubic inches, less than about 140 cubic inches, less than about 130 cubic inches, less than about 120 cubic inches, less than about 110 cubic inches, less than about 100 cubic inches, less than about 90 cubic inches, less than about 80 cubic inches, less than about 70 cubic inches, less than about 60 cubic inches, less than about 50 cubic inches, less than about 40 cubic inches, less than about 30 cubic inches, less than about 20 cubic inches, or less than about 10 cubic inches.

In certain situations, also provided herein is the utilization of unused wires or pairs in the cable to supply power in a manner that is not compliant with the appropriate standards.

Electromagnetic Interference Filters with Data Transmission that Exceeds 1 Gigabit Per Second A sixth feature of the subject matter provided herein is an electromagnetic interference filter that is compliant with a protocol with a signal having a data transmission speed that exceeds 1 gigabit per second. For example, in one embodiment, provided is an electromagnetic interference (EMI) filter comprising:
 (a) a housing comprising a substantially enclosed first compartment and a substantially enclosed second compartment;
 (b) a first circuit card located in the first compartment of the housing that converts a signal transmitted on a conductive based medium to a signal transmitted on a non-conductive based medium;
 (c) a second circuit card located in the second compartment of the housing that converts a signal transmitted on a non-conductive based medium to a signal transmitted on a conductive based medium that conveys data at a rate faster than one gigabit per second;
 (d) at least one non-conductive based medium connector that transmits a signal from the first circuit card to the second circuit card; and
 (e) at least one waveguide through which the non-conductive based medium connector passes from the first compartment to the second compartment.

In some embodiments, provided is an EMI filter wherein the signal is a network or peer-to-peer protocol. In one embodiment, the signal is 10 Gigabit Ethernet. In further or additional embodiments, provided is a signal that is a communication protocol between a host and a peripheral device. In one embodiment, the communication protocol is USB 3.0 and/or SATA 1.0, 2.0, or 3.0.

Electromagnetic Interference Filters with Data Transmission that Exceeds 1000BASE-T A seventh feature of the subject matter provided herein, provided is an electromagnetic interference filter that is compliant with a protocol with a data transmission speed that exceeds 1000BASE-T. In some embodiments, provided herein is an electromagnetic interference (EMI) filter comprising: (a) a housing comprising a substantially enclosed first compartment and a substantially enclosed second compartment; (b) a first circuit card located in the first compartment of the housing that converts a signal transmitted on a conductive based medium to a signal transmitted on a non-conductive based medium; (c) a second circuit card located in the second compartment of the housing that converts a signal transmitted on a non-conductive based medium to an Ethernet signal that is transmitted on a conductive based medium at a rate that exceeds the data transmission speed as defined by IEEE 802.3 ab-1999 standard (also referred to as 1000BASE-T); (d) at least one non-conductive based medium that transmits a signal from the first circuit card to the second circuit card; and (e) at least one waveguide through which the non-conductive based medium passes from the first compartment to the second compartment. In some embodiments, the data transmission is at a rate that is faster than one gigabit per second.

In further or additional embodiments, provided is a signal that is a network or peer-to-peer protocol. In one embodiment, the signal is 10 Gigabit Ethernet.

In further or additional embodiments, provided is a signal that is a communication protocol between a host and a peripheral device. In one embodiment, the communication protocol is USB 3.0 and/or SATA 1.0, 2.0, or 3.0.

Electromagnetic Interference Filters with at Least Two Conductive Based Media

An eighth feature of the subject matter provided herein is an electromagnetic interference filter that is compliant with at least two conductive based media. An EMI filter with at least two conductive based media is advantageous because it permits multiple forms of data transmission using a single EMI filter.

For example, in some embodiments, provided herein is an electromagnetic interference (EMI) filter comprising: (a) a housing comprising a substantially enclosed first compartment and a substantially enclosed second compartment; (b) a first circuit card located in the first compartment of the housing that converts a signal transmitted on a conductive based medium to a signal transmitted on a non-conductive based medium; (c) a second circuit card located in the second compartment of the housing that converts a signal transmitted on a non-conductive based medium to a signal transmitted on a conductive based medium; (d) at least one non-conductive based medium that transmits a signal from the first circuit card to the second circuit card; (e) at least one waveguide through which the non-conductive based medium passes from the first compartment to the second compartment; and (f) the first or second compartment further comprises at least a second conductive based medium.

Optional Features

Power Supply Variations

Also provided herein are various power supply variations of the methods, devices and systems provided herein. For example, in one embodiment, provided herein is an EMI filter that passes power from at least the first compartment to the second compartment in order for the first circuit card and the second circuit card to be powered from a single power source.

In one embodiment, the EMI filters provided herein further comprises an external AC/DC power transformer attached to the filter using a connector that does not rely solely on friction. For example, in some embodiments, the connector is a locking or screwing mechanism that is utilized to secure the connection. In still further embodiments, the EMI filters provided herein further comprise an AC/DC power transformer that is located in at least the first or second compartments.

In some embodiments, the EMI filters provided herein comprise a power supply that is a battery or fuel cell. In still further embodiments, the EMI filters provided herein further comprise a power supply that supplies power to an attached shielded enclosure. In yet an additional embodiment, an EMI filter provided herein is powered by a power source from an attached shielded enclosure.

Housing Variations

In some embodiments, the EMI filters provided herein contain a housing that has a volume that is between about 10 and about 100 cubic inches, including for example about 40 cubic inches. In some embodiments, the housing is less about 40 cubic inches. In additional embodiments, the housing is about 50 cubic inches. In still further embodiments, the volume of the housing is less than about 10 cubic inches, less than about 20 cubic inches, less than about 30 cubic inches, less than about 40 cubic inches, less than about 50 cubic inches, less than about 60 cubic inches, less than about 70 cubic inches, less than about 80 cubic inches, or less than about 90 cubic inches. In a specific embodiment, the housing of the EMI filters provided herein is less than about 41 cubic inches, less than about 42 cubic inches, less than about 43 cubic inches, less than about 44 cubic inches, less than about 45 cubic inches, less than about 46 cubic inches, less than about 47 cubic inches, less than about 48 cubic inches, or less than about 49 cubic inches.

Shielded Enclosures

In some embodiments, the EMI filters provided herein are connected to a shielded enclosure. Examples of suitable shielded enclosures include, but are not limited to, modular shielded rooms, copper screen rooms, welded room, shielded boxes, shielded racks, MRI rooms, anechoic chambers, antenna pattern measurement chambers, sensitive compartmented information facilities (SCIF). In some embodiments, the EMI filters provided herein are adhered to a shielded enclosure. In specific embodiments, the EMI filters are adhered to a shielded enclosure by mechanically, chemically, or conductively bonding the housing of the filter to an electromagnetically shielded enclosure. For example, in further embodiments, a threaded pipe attached to the housing penetrates into the electromagnetically shielded enclosure. Inside the enclosure, a conductive gasket is placed over the pipe and a flange nut is used to pull the housing tight against the enclosure and to compress the gasket until an electromagnetically tight seal is created. In still further embodiments, a bayonet style pipe is attached to the housing thereby allowing the filter to be twisted and locked into the shielded enclosure. In still further embodiments, the shielded enclosure is attached to an EMI filter using conductive epoxy, welded or soldered to the shielded enclosure.

Reduced Emissions

Also provided herein is an EMI filter that provides reduced electromagnetic emissions. One feature of the subject matter provided herein is an EMI filter that uses ferrites with a reduced initial permeability. The low initial permeability makes the ferrites particularly effective at higher frequencies which is a problem that has been identified in the art for high speed digital communications.

Permeability is the degree of magnetization that a material obtains in response to an applied magnetic field. Relative permeability, sometimes denoted by the symbol $\mu_r$, is the ratio of the permeability of a specific medium to the permeability of free space given by the magnetic constant $\mu_0 = 4\pi \times 10^{-7}$.

Initial permeability describes the relative permeability of a material at low values of magnetic flux density (below 0.1T). The maximum value for permeability in a material is frequently a factor of between 2 and 5 or more above its initial value. Initial permeability is the ratio for small magnetization of initially demagnetized material:

$$\mu_i = \frac{B}{\mu 0 * H}$$

very small H;

In some embodiments, a conductive based medium is passed through one or more ferrites having an initial permeability of less than 100, less than 90, less than 85, less than 80, or less than 75.

Also provided herein is a method for passing a signal carried on a non-conductive medium into an electromagnetically shielded enclosure without affecting the shielding effectiveness of the enclosure over a specific frequency range.

In still further embodiments of the EMI filters described herein, provided is an EMI filter that further comprises a visual communication of power or communication status. In one embodiment, provided is an EMI filter wherein the first or second compartment further comprises at least a second conductive based medium.

The examples and embodiments described herein are for illustrative purposes only and various modifications or changes are included within the spirit and purview of this application and scope of the appended claims.

EXAMPLE 1

Testing Parameters for Determining Radiated Electromagnetic Emission Amplitude (dBµV/m) Vs. Frequency (Hz) Graphs for 100BASE-T Radiated emissions testing is performed on a 100BASE-T electromagnetic interference filter that contains a housing comprising a substantially enclosed first compartment and a substantially enclosed second compartment, a first circuit card located in the first compartment of the housing that converts a signal transmitted on a conductive based medium to a signal transmitted on a non-conductive based medium, a second circuit card located in the second compartment of the housing that converts a signal transmitted on a non-conductive based medium to a signal transmitted on a conductive based medium, at least one non-conductive based medium that transmits a signal from the first circuit card to the second circuit card, and at least one waveguide through which the non-conductive based medium passes from the first compartment to the second compartment to determine the shielding effectiveness. The testing protocol is consistent with the protocols used for FCC Part 15 testing. The testing is performed by VTech Telecommunications Canada, Ltd. or other suitable contractor. The testing instruments will include a GTEM, 3 meter OATS equivalent process that is designed to determine the radiated emissions of a filter between the frequencies of 30 MHz to 1 GHz. The testing results will show that the 100BASE-T electromagnetic interference filter tested provides a radiated electromagnetic emission amplitude (dBµV/m) versus frequency (Hz) graph having a largest peak between the frequencies tests of about 30 MHz to about 1 GHz that is equal to or less than about 40 dBµV/m when measured at a distance of about 3 meters from the filter.

EXAMPLE 2

Testing Parameters for Determining Radiated Electromagnetic Emission Amplitude (dBµV/m) Vs. Frequency (Hz) Graphs for 1000BASE-T Radiated emissions testing is performed on a 1000BASE-T electromagnetic interference filter that contains a housing comprising a substantially enclosed first compartment and a substantially enclosed second compartment, a first circuit card located in the first compartment of the housing that converts a signal transmitted on a conductive based medium to a signal transmitted on a non-conductive based medium, a second circuit card located in the second compartment of the housing that converts a signal transmitted on a non-conductive based medium to a signal transmitted on a conductive based medium, at least one non-conductive based medium that transmits a signal from the first circuit card to the second circuit card, and at least one waveguide through which the non-conductive based medium passes from the first compartment to the second compartment to determine the shielding effectiveness. The testing protocol is consistent with the protocols used for FCC Part 15 testing. The testing is performed by VTech Telecommunications Canada, Ltd. or other suitable contractor. The testing instruments will include a GTEM, 3 meter OATS equivalent process that is designed to determine the radiated emissions of a filter between the frequencies of 30 MHz to 1 GHz. The testing results will show that the 1000BASE-T electromagnetic interference filter tested provides a radiated electromagnetic emission amplitude (dBµV/m) versus frequency (Hz) graph having a largest peak between the frequencies tests of about 30 MHz to about 1 GHz that is equal to or less than about 44 dBµV/m when measured at a distance of about 3 meters from the filter.

What is claimed is:

1. An electromagnetic interference (EMI) filter comprising:
   (a) a housing comprising a substantially enclosed first compartment and a substantially enclosed second compartment;
   (b) a first circuit card located in the first compartment of the housing that converts a signal transmitted on a conductive based medium to a signal transmitted on a non-conductive based medium;
   (c) a second circuit card located in the second compartment of the housing that converts a signal transmitted on a non-conductive based medium to an Ethernet signal;
   (d) at least one non-conductive based medium that transmits a signal from the first circuit card to the second circuit card; and
   (e) at least one waveguide through which the non-conductive based medium passes from the first compartment to the second compartment;
   the filter providing a radiated electromagnetic emission amplitude (dBµV/m) versus frequency (Hz) graph having a largest peak within a frequency range of about 30 MHz to about 1 GHz that is equal to or less than about 44 dBµV/m when measured at a distance of about 3 meters from the filter.

2. The filter of claim 1 wherein the Ethernet signal is transmitted at a rate of at least about 100 megabits per second and provides a radiated electromagnetic emission amplitude (dBµV/m) versus frequency (Hz) graph having a largest peak within the frequency range of about 30 MHz to about 1 GHz that is equal to or less than about 40 dBµV/m when measured at a distance of about 3 meters from the filter.

3. The first or second compartment of claim 1 that incorporates at least one solid or braided shield to separate all or a portion of at least one circuit card from a conductor based medium.

4. The conductive based medium of claim 1 that that passes through one or more ferrites having an initial permeability that is equal to or less than about 100.

5. The conductive based medium of claim 1 that passes through at least one additional electromagnetic interference filter before exiting a compartment.

6. An electromagnetic interference (EMI) filter comprising:
   (a) a housing comprising a substantially enclosed first compartment and a substantially enclosed second compartment;
   (b) a first circuit card that converts a signal transmitted on a conductive based medium to a signal transmitted on a non-conductive based medium and located in the first compartment of the housing;
   (c) a second circuit card located in the second compartment of the housing that converts a signal transmitted on a non-conductive based medium to a signal transmitted on a conductive based medium;
   (d) at least one non-conductive based medium that transmits a signal from the first circuit card to the second circuit card; and
   (e) at least one waveguide through which the non-conductive based medium passes from the first compartment to the second compartment;
wherein the filter utilizes, passes, or transmits a digital signal with integrated power.

7. The housing of claim 6 that has a volume that is equal to or less than about 150 cubic inches.

8. The signal of claim 6(d) that comprises a network or peer-to-peer protocol.

9. The signal of claim 6(d) that comprises a communication protocol between a host and peripheral device.

10. An electromagnetic interference (EMI) filter comprising:
    (a) a housing comprising a substantially enclosed first compartment and a substantially enclosed second compartment;
    (b) a first circuit card located in the first compartment of the housing that converts a signal transmitted on a conductive based medium to a signal transmitted on a non-conductive based medium;
    (c) a second circuit card located in the second compartment of the housing that converts a signal transmitted on a non-conductive based medium to a signal transmitted on a conductive based medium that conveys data at a rate faster than one gigabit per second;
    (d) at least one non-conductive based medium connector that transmits a signal from the first circuit card to the second circuit card; and
    (e) at least one waveguide through which the non-conductive based medium connector passes from the first compartment to the second compartment.

11. The signal of claim 10(d) that comprises a network or peer-to-peer protocol.

12. The signal of claim 10(d) that is a communication protocol between a host and peripheral device.

13. The first or second compartment of claim 1, 6, or 10 that has been completely or partially filled with a non-conductive solid compound, comprises a ferrite loaded compound or comprises a conformal coating.

14. The housing of claim 1, 6, or 10 that further comprises an antichafe material.

15. The filter of claim 1, 6, or 10 that further comprises an AC/DC power transformer that is located in at least the first or second compartments.

16. The filter of claim 1, 6 or 10 that further comprises a power source that is supplied by the same cable transmitting a communication signal.

17. The filter of claim 1, 6, or 10 that further comprises a power supply that is a battery or fuel cell.

18. The housing of claim 1, 6, or 10 that that has a volume that is equal to or less than about 40 cubic inches.

19. The waveguide of claim 1, 6, or 10, that has an inner diameter that is equal to or less than about 1 inch.

20. The filter of claim 1, 6, or 10 that is designed for use in rugged military environments or battlefield environments as specified by a military organization.

* * * * *